(12) United States Patent
Lee et al.

(10) Patent No.: US 8,332,701 B2
(45) Date of Patent: Dec. 11, 2012

(54) ADDRESS GENERATION APPARATUS AND METHOD FOR QUADRATIC PERMUTATION POLYNOMIAL INTERLEAVER DE-INTERLEAVER

(75) Inventors: Shuenn-Gi Lee, Hsinchu (TW);
Chung-Hsuan Wang, Hsinchu (TW);
Wern-Ho Sheen, Chiayi (TW)

(73) Assignees: Industrial Technology Research Institute, Hsinchu (TW); National Chiao Tung University, Hsinchu (TW)

( * ) Notice: Subject to any disclaimer, the term of this patent is extended or adjusted under 35 U.S.C. 154(b) by 528 days.

(21) Appl. No.: 12/647,394

(22) Filed: Dec. 25, 2009

(65) Prior Publication Data

US 2011/0066914 A1    Mar. 17, 2011

(30) Foreign Application Priority Data

Sep. 11, 2009  (TW) .............................. 98130766 A

(51) Int. Cl.
*G06F 11/00*   (2006.01)
(52) U.S. Cl. ............. 714/743; 711/5; 711/127; 711/157; 711/218
(58) Field of Classification Search .................. None
See application file for complete search history.

(56) References Cited

U.S. PATENT DOCUMENTS

| | | | |
|---|---|---|---|
| 6,202,178 B1 | 3/2001 | Spruyt | |
| 6,845,482 B2 | 1/2005 | Yao et al. | |
| 7,210,076 B2 | 4/2007 | Maru | |
| 8,140,932 B2* | 3/2012 | Blankenship | 714/755 |
| 2008/0115034 A1 | 5/2008 | Cheng | |
| 2008/0172591 A1* | 7/2008 | Shen et al. | 714/755 |
| 2010/0005221 A1* | 1/2010 | Nieminen | 711/5 |

FOREIGN PATENT DOCUMENTS

| | | |
|---|---|---|
| CN | 1246991 A | 3/2000 |
| TW | 200833039 A | 8/2008 |
| TW | 200845594 A | 11/2008 |
| TW | 200929892 A | 7/2009 |

OTHER PUBLICATIONS

Oscar Y. Takeshita, Member, IEEE, and Daniel J. Costello, Jr., Fellow, IEEE, "New Deterministic Interleaver Designs for Turbo Codes", IEEE Transactions on Information Theory, vol. 46, No. 6, pp. 1988-2006, Sep. 2000.

Jing Sun, Student Member, IEEE, and Oscar Y. Takeshita, Member, IEEE, "Interleavers for Turbo Codes Using Permutation Polynomials Over Integer Rings", IEEE Transactions on Information Theory, vol. 51, No. 1., pp. 101-119, Jan. 2005.

(Continued)

*Primary Examiner* — Christopher McCarthy
(74) *Attorney, Agent, or Firm* — Lin & Associates IP, Inc.

(57) ABSTRACT

An address generation apparatus for a quadratic permutation polynomial (QPP) interleaver is provided. It comprises a basic recursive unit, and L recursive units represented by first recursive unit up to $L^{th}$ recursive units. The apparatus inputs a plurality of configurable parameters according to a QPP function $\Pi(i)=(f_1 i+f_2 i^2) \mod k$, generates a plurality of interleaver addresses in serial via the basic recursive unit, and generates L groups of corresponding interleaver addresses via the first up to the $L^{th}$ recursive units, wherein $\Pi(i)$ is the i-th interleaver address generated by the apparatus, $f_1$ and $f_2$ are QPP coefficients, and k is information block length of an input sequence, $0 \leq i \leq k-1$.

25 Claims, 17 Drawing Sheets

OTHER PUBLICATIONS

Rostislav (Reuven) Dobkin, Michael Peleg, Senior Member, IEEE, and Ran Ginosar, "Parallel Interleaver Design and VLSI Architecture for Low-Latency MAP Turbo Decoders", IEEE Transactions on Very Large Scale Integration (VLSI) Systems, vol. 13, No. 4, pp. 427-438, Apr. 2005.

Maurizio Martina, Member, IEEE, Mario Nicola, Member, IEEE, and Guido Masera, Senior Member, IEEE, "A Flexible UMTS-WiMax Turbo Decoder Architecture", IEEE Transactions on Circuits and Systems—II: Express Briefs, vol. 55, No. 4, Apr. 2008.

Ajit Nimbalker, Member, IEEE, T. Keith Blankenship, Member, IEEE, Brian Classon, Senior Member, IEEE, Thomas E. Fuja, Fellow, IEEE, and Daniel J. Costello, Jr., Life Fellow, IEEE, "Contention-Free Interleavers for High-Throughput Turbo Decoding", IEEE Transactions on Communications, vol. 56, No. 8, Aug. 2008.

Nimbalker, A.; Blankenship, Y.; Classon, B,; Blankenship, T. K.;, "ARP and QPP Interleavers for LTE Turbo Coding", Wireless Communications and Networking Conference, 2008. WCNC 2008, IEEE, vol., No., pp. 1032-1037, Mar. 31, 2008-Apr. 3, 2008.

Taiwan Patent Office, Office Action, Patent Application Serial No. TW098130766, Aug. 31, 2012, Taiwan.

China Patent Office, Office Action, Patent Application Serial No. CN200910176899.1, Aug. 27, 2012, China.

* cited by examiner

FIG. 2
(Prior Art)

| ITERATION i | INTERLEAVER ADDRESS | SLIDING WINDOW | BINARY | LSB 3 BITS (MEMORY ADDRESS) | MSB 3 BITS | MEMORY |
|---|---|---|---|---|---|---|
| 0 | Π(0)=0 | 0 | 000000 | 000 | 000 | 0 |
|   | Π(0+8)=24 | 1 | 011000 | 000 | 011 | 3 |
|   | Π(0+16)=8 | 2 | 001000 | 000 | 001 | 1 |
|   | Π(0+24)=32 | 3 | 100000 | 000 | 100 | 4 |
|   | Π(0+32)=16 | 4 | 010000 | 000 | 010 | 2 |
| 1 | Π(1)=3 | 0 | 001101 | 101 | 001 | 1 |
|   | Π(9)=37 | 1 | 100101 | 101 | 100 | 4 |
|   | Π(17)=21 | 2 | 010101 | 101 | 010 | 2 |
|   | Π(25)=5 | 3 | 000101 | 101 | 000 | 0 |
|   | Π(33)=29 | 4 | 011101 | 101 | 011 | 3 |
| ... | ... | ... | ... | ... | ... | ... |

FIG. 13

| i | Π(i) | MEMORY | BINARY | LSB 3 BITS |
|---|---|---|---|---|
| 0 | 0 | 0 | 000000 | 0 |
| 1 | 13 | 1 | 001101 | 5 |
| 2 | 6 | 0 | 000110 | 6 |
| 3 | 19 | 2 | 010011 | 3 |
| 4 | 12 | 1 | 001100 | 4 |
| 5 | 25 | 3 | 011001 | 1 |
| 6 | 18 | 2 | 010010 | 2 |
| 7 | 31 | 3 | 011111 | 7 |
| 8 | 24 | 3 | 110000 | 0 |
| 9 | 37 | 4 | 100101 | 5 |
| 10 | 30 | 3 | 011110 | 6 |
| 11 | 3 | 0 | 000011 | 3 |
| 12 | 36 | 4 | 100100 | 4 |
| 13 | 9 | 1 | 001001 | 1 |
| 14 | 2 | 0 | 000010 | 2 |
| 15 | 15 | 1 | 001111 | 7 |
| 16 | 8 | 1 | 001000 | 0 |
| 17 | 21 | 2 | 010101 | 5 |
| 18 | 14 | 1 | 001110 | 6 |
| 19 | 27 | 3 | 011011 | 3 |
| 20 | 20 | 2 | 010100 | 4 |
| 21 | 33 | 4 | 100001 | 1 |
| 22 | 26 | 3 | 011010 | 2 |
| 23 | 39 | 4 | 100111 | 7 |
| 24 | 32 | 4 | 100000 | 0 |
| 25 | 5 | 0 | 000101 | 5 |
| 26 | 38 | 4 | 100110 | 6 |
| 27 | 11 | 1 | 001011 | 3 |
| 28 | 4 | 0 | 000100 | 4 |
| 29 | 17 | 2 | 010001 | 1 |
| 30 | 10 | 1 | 001010 | 2 |
| 31 | 23 | 2 | 010111 | 7 |
| 32 | 16 | 2 | 010000 | 0 |
| 33 | 29 | 3 | 011101 | 5 |
| 34 | 22 | 2 | 010110 | 6 |
| 35 | 35 | 4 | 100011 | 3 |
| 36 | 28 | 3 | 011100 | 4 |
| 37 | 1 | 0 | 000001 | 1 |
| 38 | 34 | 4 | 100010 | 2 |
| 39 | 7 | 0 | 000111 | 7 |

FIG. 14

ADDRESS GENERATION APPARATUS AND METHOD FOR QUADRATIC PERMUTATION POLYNOMIAL INTERLEAVER DE-INTERLEAVER

TECHNICAL FIELD

The present invention generally relates to an address generation apparatus and method for a quadratic permutation polynomial (QPP) interleaver.

BACKGROUND

In recent years, most of the mobile communication (3GPP LTE) systems have replaced the turbo code interleaver of the physical layer in 3G mobile communication system with the QPP interleaver to improve the decoding speed of the decoders. QPP interleaver, in addition to the advantage of memory contention free, shows promising results in both hardware complexity and decoding capability. QPP interleaver allows the turbo decoding to avoid the memory contention problem after the maximum A posterior probability (MAP) algorithm computing the MAP, while in the mean time, using a plurality of sliding windows to achieve the parallelism to accelerate the computation of decoder.

The common design for turbo code interleaver is to store the computed interleaver address in a memory or an address table in advance, as the serial and parallel structure shown in FIG. 1A and FIG. 1B. In the serial structure of FIG. 1A, after a sliding window 110 outputs one extrinsic information 110a, sliding window 110 needs an interleaver address; hence, a corresponding interleaver address in an address table 120 is read to act as the address of memory 130 for storing extrinsic information 110a.

In the parallel structure of FIG. 1B, after a sliding window outputs a plurality of intrinsic information, a plurality of corresponding interleaver addresses are read from an address table 121. In combination with a data multiplexer 125 for selecting, these addresses are used as the corresponding addresses in the memory for storing the plurality of extrinsic information.

Take LTE turbo code as example. The decoding length may range from 40 to 6144 bits. In other words, the number of bits in each code segment may range from 40 to 6144 bits. For 188 types of decoding length specifications, the memory must be able to store 188 interleaver addresses of length ranging from 40 to 6144 bits. This is a considerable demand on the memory capacity.

For example, U.S. Pat. No. 6,845,482 disclosed an element for generating prime number index information and a technology of five lookup tables, as shown in FIG. 2, for generating memory address of turbo code interleaver. The memory address generation technology generates interleaved address of turbo code that is compliant to W-CDMA standard. For all the possible code segment lengths supported in W-CDMA standard, table 210 stores all the possibly used prime numbers, 52 prime numbers in total. Table 220 stores four inter-row permutation sequences 221-224. Table 230 stores 52 intra-row base sequences. Each prime number P in table 230 corresponds to an intra-row base sequence. The length of the intra-row base sequence is P−1. Table 240 stores the starting addresses of these 52 intra-row base sequences. Table 250 stores 52 prime number sequences, with each prime number sequence having the length of 20.

U.S. Patent Publication No. US2008/0115034 disclosed a QPP interleaver, applicable to an encoder for turbo code. In FIG. 3, QPP interleaver 300 includes an interleaver memory 310, an address generator 320 and a control unit 330. Modulo-counter 331 of control unit 330 provides an input index n to address generator 320. The n-th value Π(n) of the output sequence of address generator 320 may be described as:

$$\Pi(n)=(f_1 n+f_2 n^2) \bmod k, n=0, 1, \ldots, k-1,$$

Where $\Pi(n)$ is the n-th interleaved output position, $f_1$ and $f_2$ are QPP coefficients, k is the information block length of the input sequence, and mod is the modulus computation. The computed $\Pi(n)$ is stored in interleaver memory 310, and is serially read out from interleaver memory 310 when needed.

SUMMARY

The disclosed exemplary embodiments may provide an address generation apparatus and method for a QPP interleaver.

In an exemplary embodiment, the disclosed relates to an address generation apparatus for a QPP interleaver. The apparatus comprises a basic recursive unit, and L recursive units represented as the first to the L-th recursive units, where $L \geq 2$. Based on a QPP function $\Pi(i)=(f_1 i+f_2 i^2) \bmod k$, the apparatus inputs a plurality of configurable parameters, serially generates a plurality of interleaver addresses by using the basic recursive unit, and parallel generates L sets of corresponding interleaver addresses by using the first to L-th recursive units, wherein whenever the basic recursive unit or the j-th recursive unit generates an interleaver address, the interleaver address generated by the basic recursive unit is outputted to the first recursive unit, while the interleaver address generated by the j-th recursive unit is outputted to the (j+1)-th recursive unit, $\Pi(i)$ is the i-th interleaved address generated by the apparatus, $f_1$ and $f_2$ are QPP coefficients, k is information block length of an input sequence, $1 \leq i \leq k-1$, $1 \leq j \leq L-1$, and mod is modulus computation.

In another exemplary embodiment, the disclosed relates to an address generation method for QPP interleaver, applicable to an encoder/decoder of communication systems. The method comprises: based on a QPP function $\Pi(i)=(f_1 i+f_2 i^2) \bmod k$, inputting a plurality of configurable parameters; serially generating a plurality of interleaver addresses by using a basic recursive unit; and parallel generating L sets of corresponding interleaver addresses by using L recursive units represented as the first to L-th recursive units, $L \geq 2$, wherein whenever the basic recursive unit or the j-th recursive unit generates an interleaver address, the interleaver address generated by the basic recursive unit is outputted to the first recursive unit, while the interleaver address generated by the j-th recursive unit is outputted to the (j+1)-th recursive unit, $\Pi(i)$ is the i-th interleaved address generated by the apparatus, $f_1$ and $f_2$ are QPP coefficients, k is information block length of an input sequence, $0 \leq i \leq k-1$, $1 \leq j \leq L-1$, and mod is modulus computation, so that the information of the input sequence is stored in a plurality of corresponding memory addresses.

The foregoing and other features, aspects and advantages of the exemplary embodiments will become better understood from a careful reading of a detailed description provided herein below with appropriate reference to the accompanying drawings.

BRIEF DESCRIPTION OF THE DRAWINGS

Figure 2:
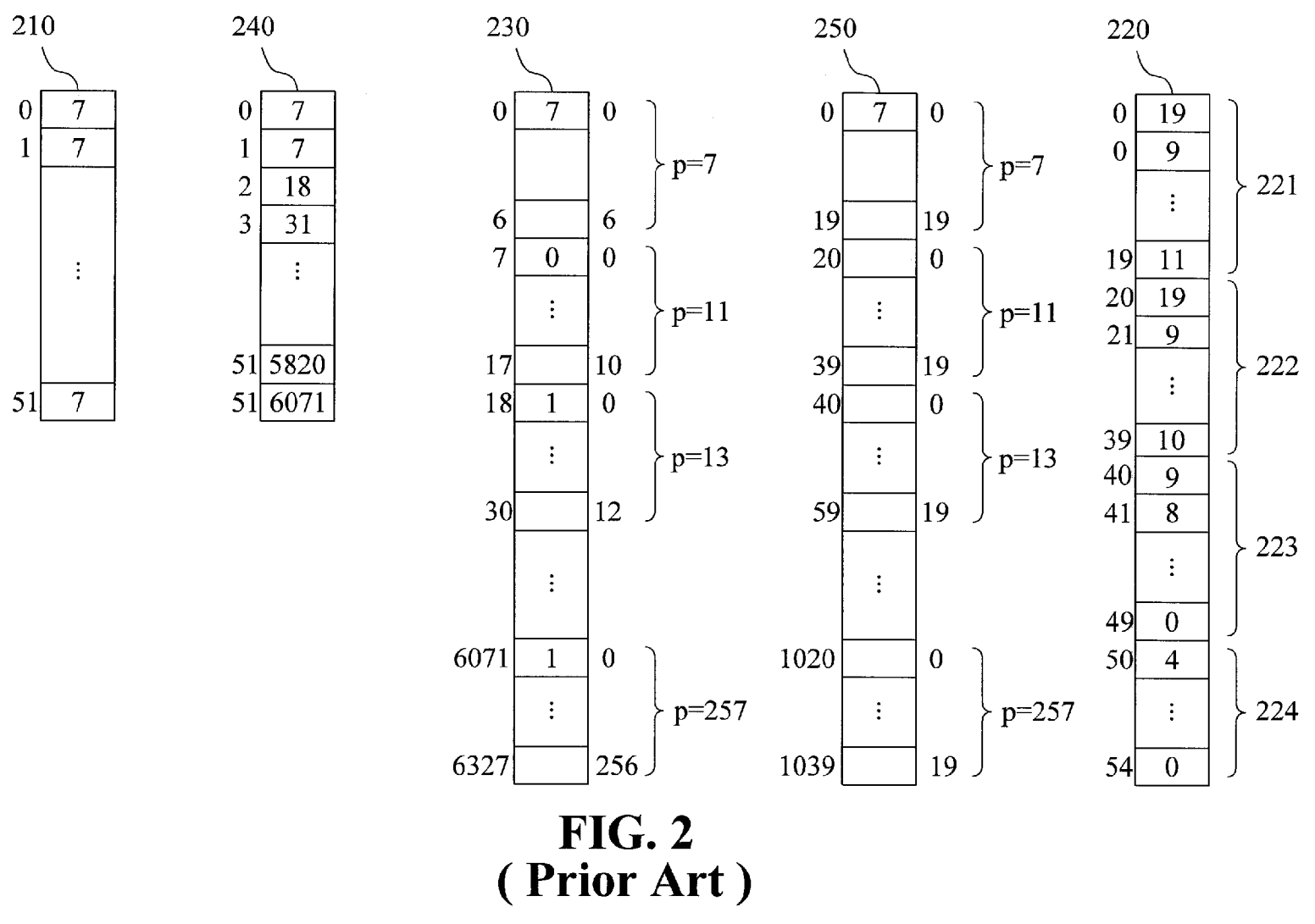

FIG. 2 shows an exemplary schematic view of a table for generating memory address for turbo code interleaver.

FIG. 13 shows an exemplary schematic view of using k=40, M=$2^3$, $f_1$=3, $f_2$=10, as example to describe how to determine memory address through the interleaver address computed by an address generation apparatus for a QPP interleaver, consistent with certain disclosed embodiments.

FIG. 14 shows an exemplary table, illustrating the data outputted from sliding window of FIG. 13, corresponding interleaver address $\Pi(i)$, binary representation, LSB 3 bits and memory, consistent with certain disclosed embodiments.

DETAILED DESCRIPTION OF THE EXEMPLARY EMBODIMENTS

The disclosed exemplary embodiments may provide an address generation apparatus and method for a QPP interleaver. The address generation technology for QPP interleaver utilizes hardware design able to directly compute the interleaver address and able to output the computation result of the interleaver address serially or in parallel.

Figure 1A:
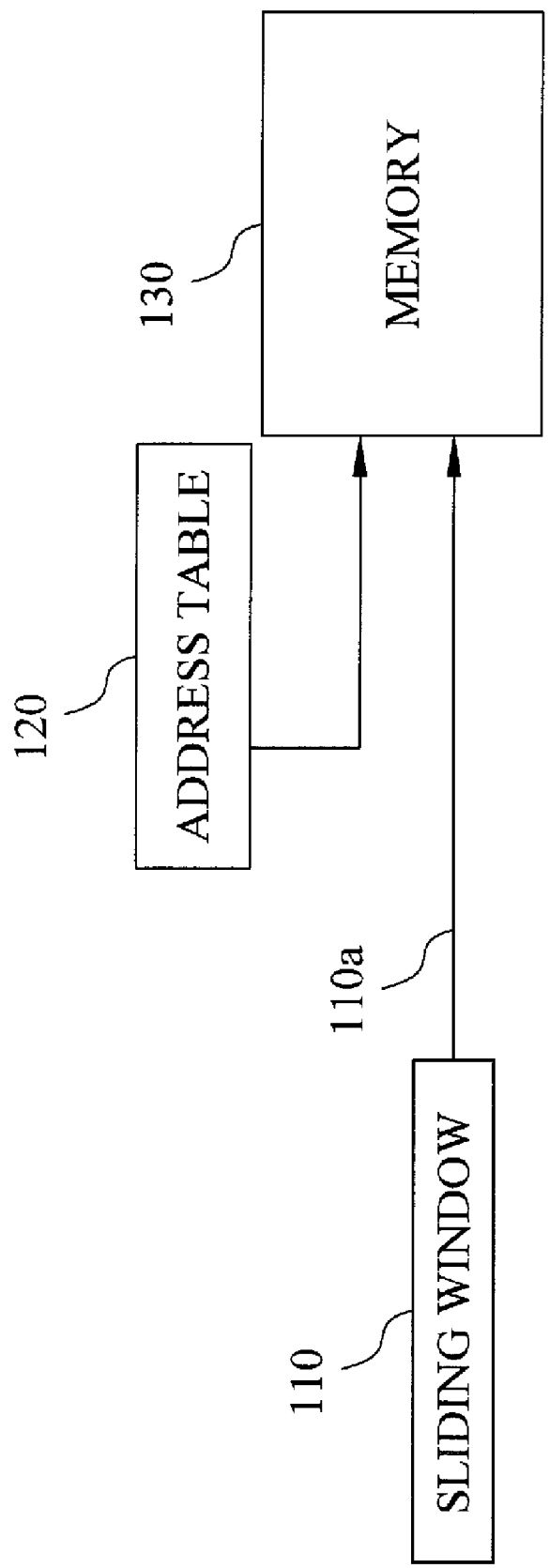
FIG. 1A shows an exemplary schematic view of a serial structure using an address table to output interleaver address to store external information to corresponding memory addresses.
Figure 1B:
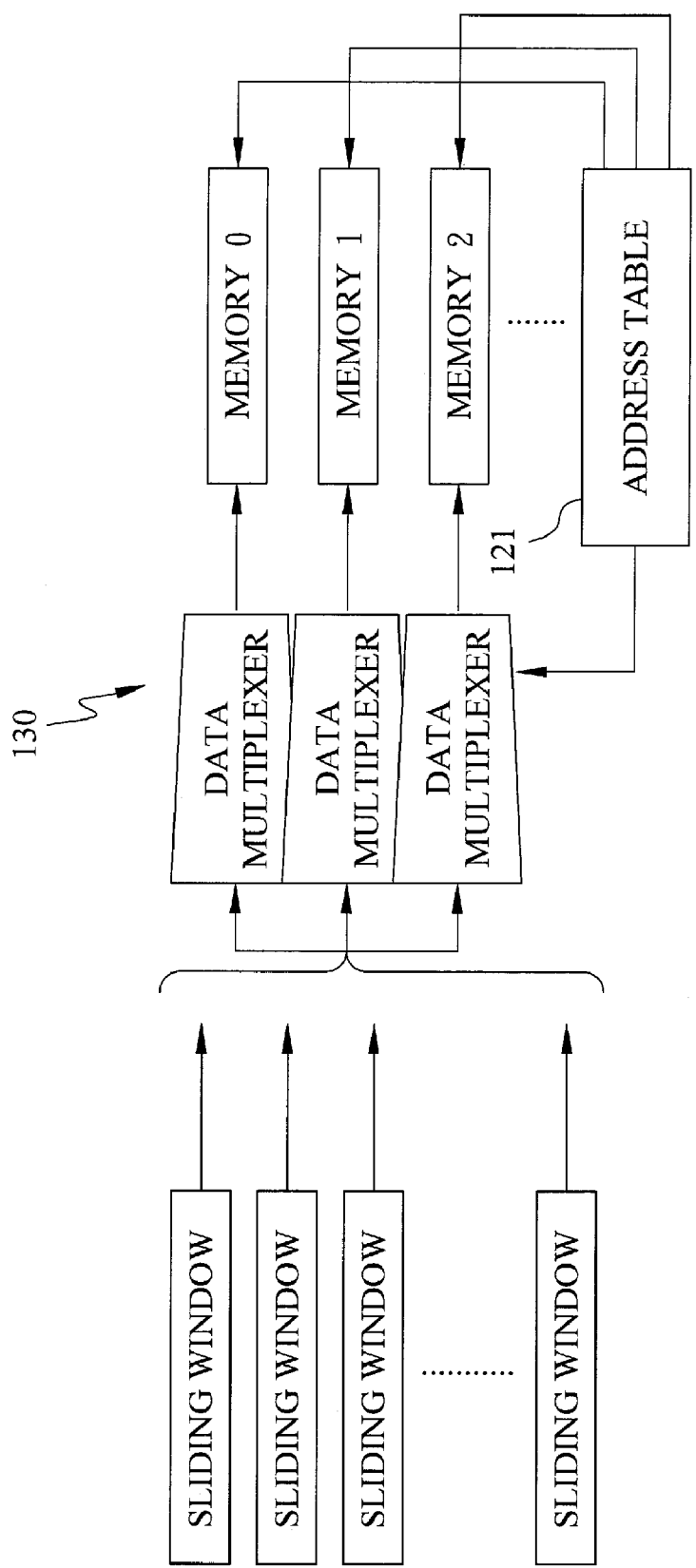
FIG. 1B shows a schematic view of a parallel structure using an address table to output interleaver address to store external information to corresponding memory addresses.
Figure 3:
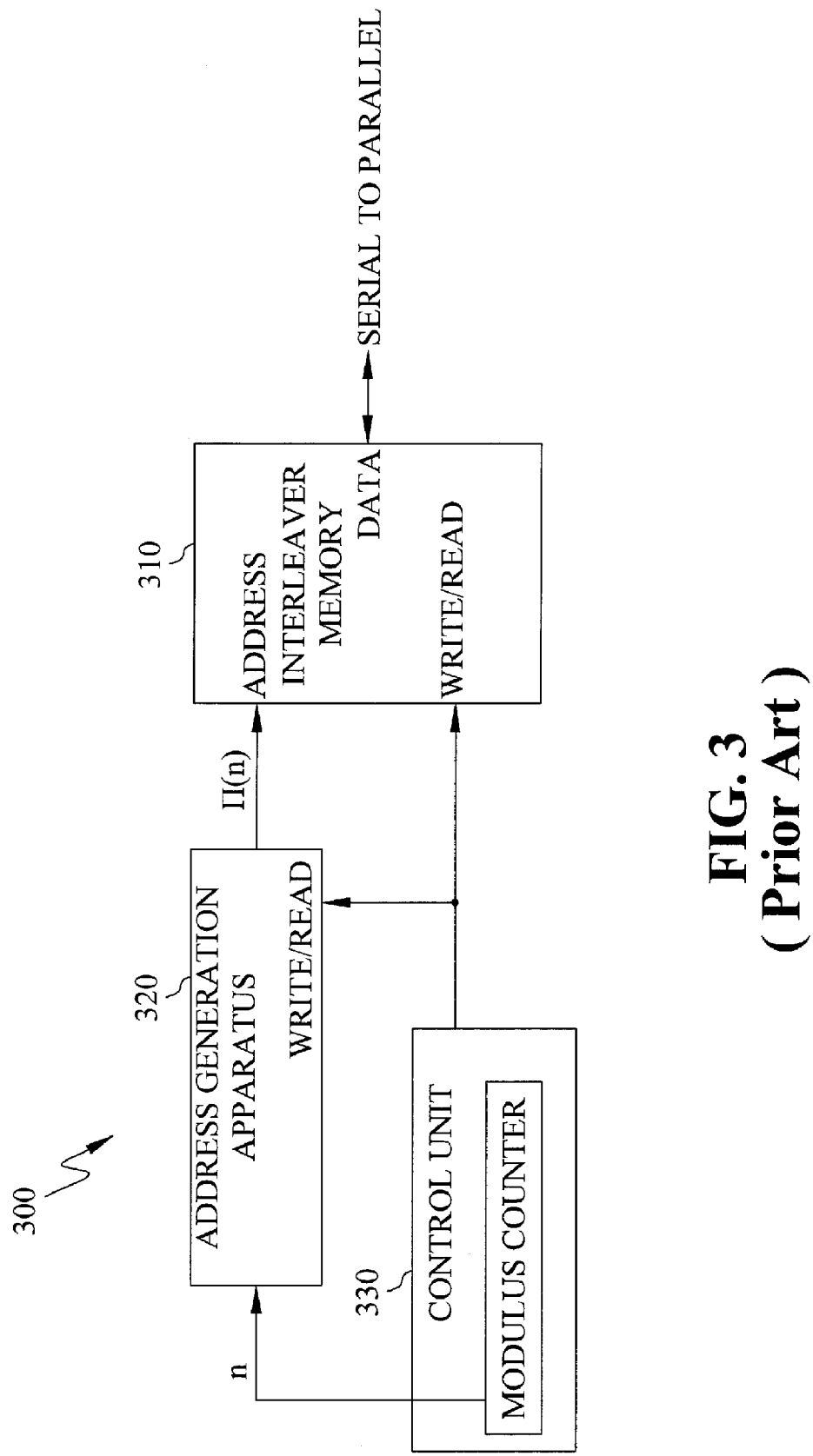
FIG. 3 shows an exemplary schematic view of a QPP interleaver.
Figure 4:
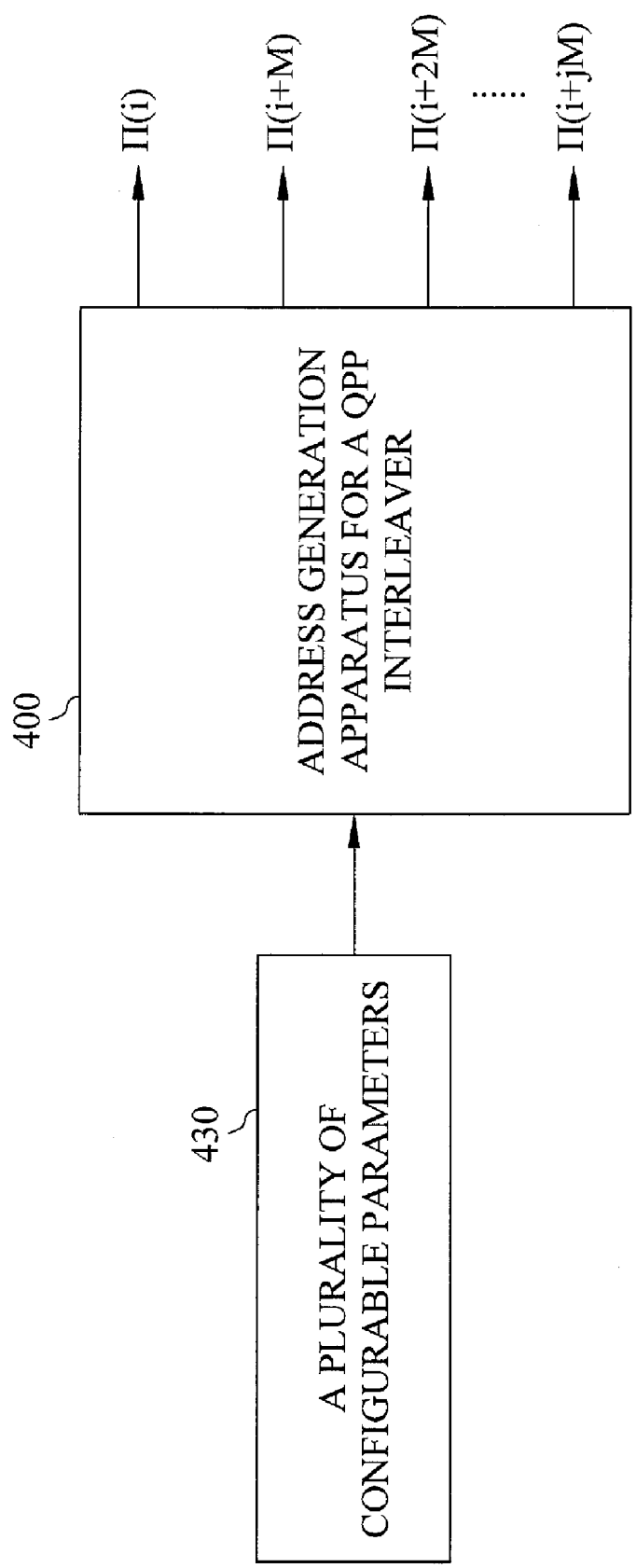
FIG. 4 shows an exemplary schematic view of an address generation apparatus for a QPP interleaver, consistent with certain disclosed embodiments.

FIG. 4 shows an exemplary schematic view of an address generation apparatus for a QPP interleaver, consistent with certain disclosed embodiments. In FIG. 4, address generation apparatus 400 for a QPP interleaver, based on a QPP function $\Pi(i)=(f_1 i+f_2 i^2)$ mod k, inputs a plurality of configurable parameters 430, such as, {k, ($f_1+f_2$) mod k, $2f_2$ mod k, $2Mf_2$ mod k, $f_1M$ mod k, $f_2M^2$ mod k} or {k, $f_1+f_2$, $2f_2$, $2Mf_2$, and $f_1M+f_2M^2$}, to output interleaver address $\Pi(i+jM)$ in parallel or output interleaver address $\Pi(i)$ serially, where $\Pi(i)$ is the i-th interleaver address generated by address generation apparatus 400 for the QPP interleaver, $f_1$ and $f_2$ are QPP coefficients, $0 \leq i \leq k-1$, $1 \leq j \leq L-1$, k is the information block length of an input sequence, M is the width of the sliding window for outputting the input sequence information, and L is the number of interleaver addresses $\Pi(i+jM)$ in a parallel output.

Address generation apparatus 400 for a QPP interleaver may be used as both an interleaver and a de-interleaver. When used as an address generation apparatus for de-interleaver, the outputting of interleaver address is treated as reading a memory address.

The theory behind the ability of address generation apparatus 400 for a QPP interleaver to output the interleaver addresses serially or in parallel is described as follows:

Because QPP function $\Pi(i)=(f_1 i+f_2 i^2)$ mod k, $i=0, 1, \ldots, k-1$, hence, $\Pi(i+m)=(f_1(i+m)+f_2(i+m)^2)$ mod $k=(\Pi(i)+f_1 m+f_2 m^2+2 m f_2 i)$ mod $k$ When m=1, $$\Pi(i+1)=(\Pi(i)+f_1 m+f_2+2f_2 i) \bmod k, i=0, 1, \ldots, k-1 \quad (1)$$

hence, address generation apparatus 400 for a QPP interleaver may directly compute the interleaver addresses $\Pi(0)$, $\Pi(1)$, $\Pi(2)$, etc., serially according to the recursive formula (1).

When m=M, 2M, 3M, . . . , $$\Pi(i+M)=(\Pi(i)+f_1 M+f_2 M^2+2f_2 i) \bmod k, i=0, 1, \ldots, k-1 \quad (2)$$

hence, address generation apparatus 400 for a QPP interleaver may directly compute the interleaver addresses $\Pi(i)$, $\Pi(i+M)$, $\Pi(i+2M)$, etc., in parallel according to the recursive formula (2). Take M=32 as example, address generation apparatus 400 for QPP interleaver may output a plurality of sequences in parallel, where the first sequence $\{\Pi(i+M)\}$ includes $\Pi(32)$, $\Pi(33)$, $\Pi(34)$, . . . ;

the second sequence $\{\Pi(i+2M)\}$ includes $\Pi(64)$, $\Pi(65)$, $\Pi(66)$, . . . ;

the third sequence $\Pi(i+3M)\}$, the fourth sequence $\{\Pi(i+4M)\}$, and so on. M is the number of the elements in each sequence, i.e., the width of the sliding window.

Figure 5:
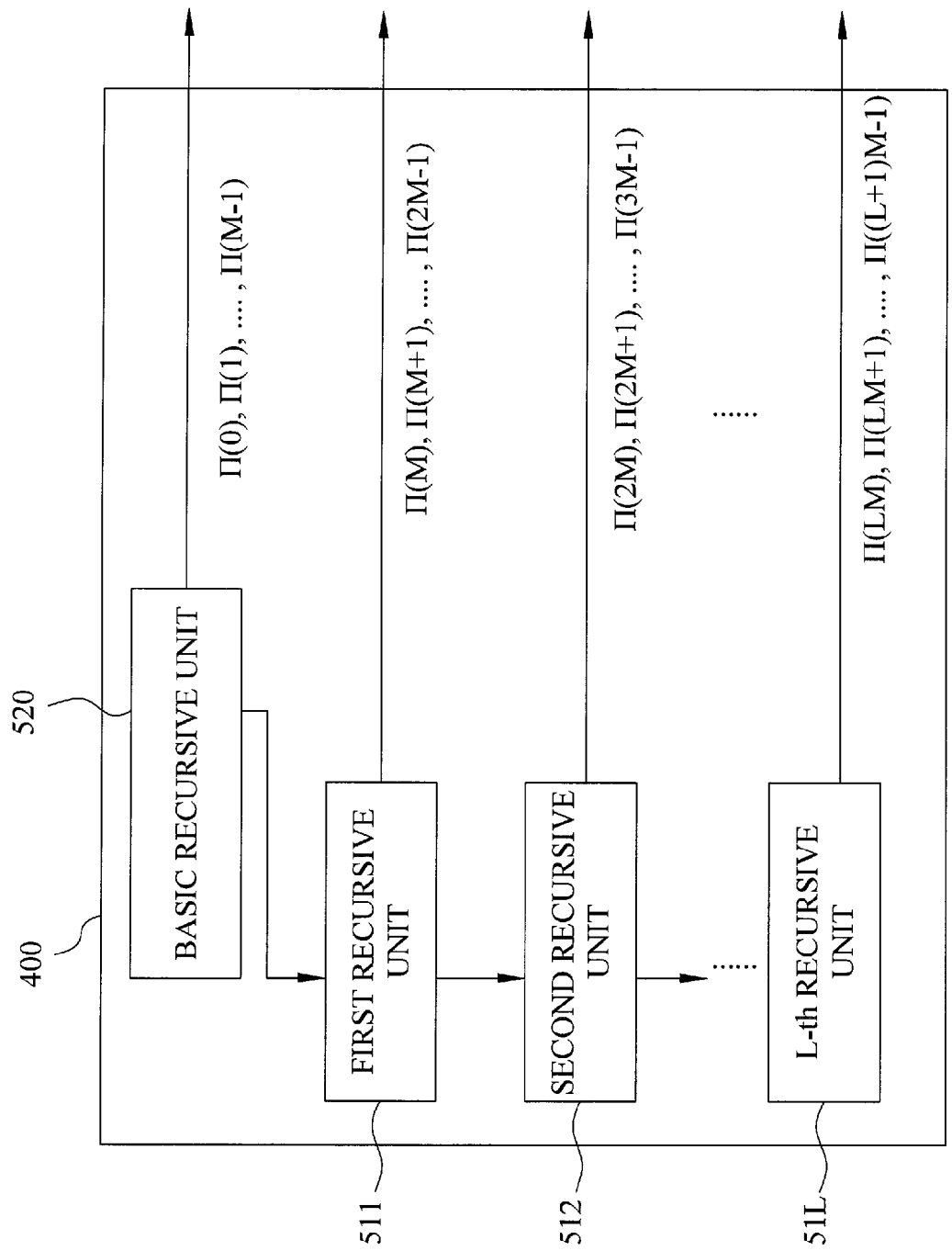
FIG. 5 shows an exemplary schematic view of the structure of an address generation apparatus for a QPP interleaver, consistent with certain disclosed embodiments.

Accordingly, shows an exemplary schematic view of the structure of an address generation apparatus 400 for a QPP interleaver, consistent with certain disclosed embodiments. Referring to FIG. 5, address generation apparatus 400 for a QPP interleaver comprises a basic recursive unit 520, and L recursive units, represented as first recursive unit 511 to L-th recursive unit 51L, where L is an integer greater than 1. Basic recursive unit 520 may be used for generating serial output, i.e., computing the interleaver addresses $\Pi(0)$, $\Pi(1)$, $\Pi(2)$, . . . , $\Pi(M-1)$ serially. The initial value $\Pi(0)$ of the interleaver address may be set to an integer constant, such as, 0. First recursive unit 511 to L-th recursive unit 51L may be used to compute interlayer addresses in parallel, i.e., First sequence: $\Pi(M)$, $\Pi(M+1)$, . . . , $\Pi(2M-1)$;
Second sequence: $\Pi(2M)$, $\Pi(2M+1)$, . . . , $\Pi(3M-1)$; up to
L-th sequence: $\Pi(LM)$, $\Pi(LM+1)$, . . . , $\Pi((L+1)M-1)$ Basic recursive unit 520 and j-th recursive unit also output respectively to first recursive unit 511 and (j+1)-th recursive unit when generating each interleaver address. For example, whenever basic recursive unit 520 generates an interleaver address, basic recursive unit 520 outputs the interleaver address to first recursive unit 511. And, whenever first recursive unit 511 generates an interleaver address, first recursive unit 511 outputs the interleaver address to second recursive unit 512. Whenever second recursive unit 512 generates an interleaver address, second recursive unit 512 outputs the interleaver address to third recursive unit 513, and so on. The value L is the number of the sliding windows.

If the width M of sliding window is a power of 2, such as, $M=2^n$, the n least significant bits (LSB) of the computed interleaver address may be used as the memory address for storing the input information.

Basic recursive unit 520 inputs configurable parameters, such as, $\{\Pi(0), f_1+f_2, 2f_2\}$ or $\{f_1+f_2, 2f_2\}$, and generates output sequence $\Pi(0), \Pi(1), \Pi(2)$, and so on. Each i-th recursive unit inputs respectively configurable parameters, such as, $\{\Pi(i+m_1), h(i), 2m_2f_2\}$ or $\{k, 2Mf_2, f_1M+f_2M^2\}$, $1 \leq i \leq L$, $m_1$ and $m_2$ are pre-defined integers, $h(i)$ is a pre-defined recursive function, $m_1$, $m_2$ and $h(i)$ will be described in details later. The L recursive units may generate L sequences $\{\Pi(i+M)\}, \{\Pi(i+2M)\}, \ldots, \{\Pi(i+LM)\}$ in parallel. In other words, with basic recursive unit, it is possible to realize a serial interleaver address generator, and with first to L-th recursive units, it is possible to realize a parallel interleaver address generator. The following two exemplary embodiments show the address generation apparatus and method for a QPP interleaver.

In the first exemplary embodiment, the basic recursive unit is designed in accordance with recursive formula (1), and using a recursive function $g(i)$, $i=0, 1, \ldots, k-1$, where $$\Pi(i+1) = (\Pi(i)+g(i)) \bmod k,$$

$$g(i) = (f_1+f_2+2f_2 i) \bmod k, \text{ and } g(i+1) = g(i)+2f_2.$$

Figure 6A:
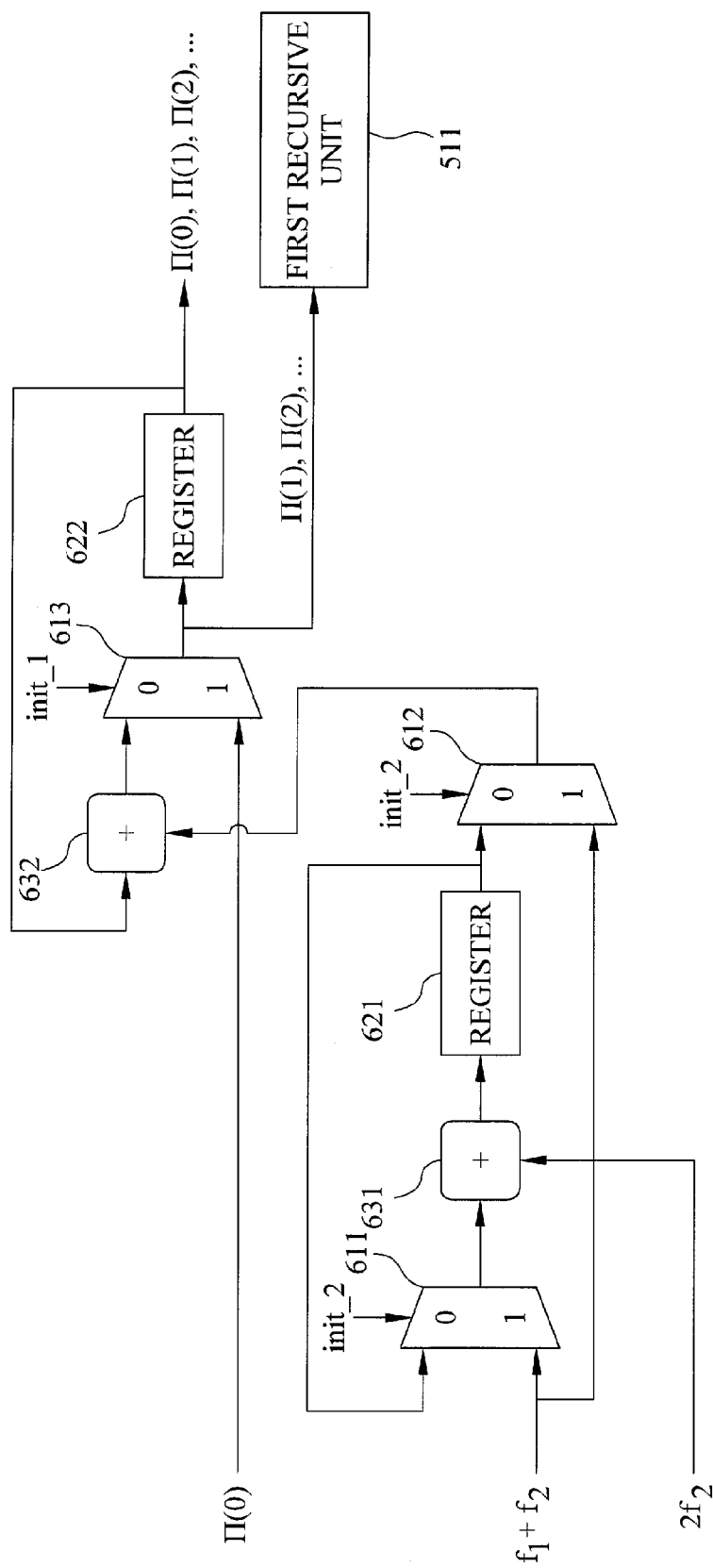
FIG. 6A shows an exemplary schematic view of the hardware structure of the basic recursive unit of a first exemplary embodiment, consistent with certain disclosed embodiments.
Figure 6B:
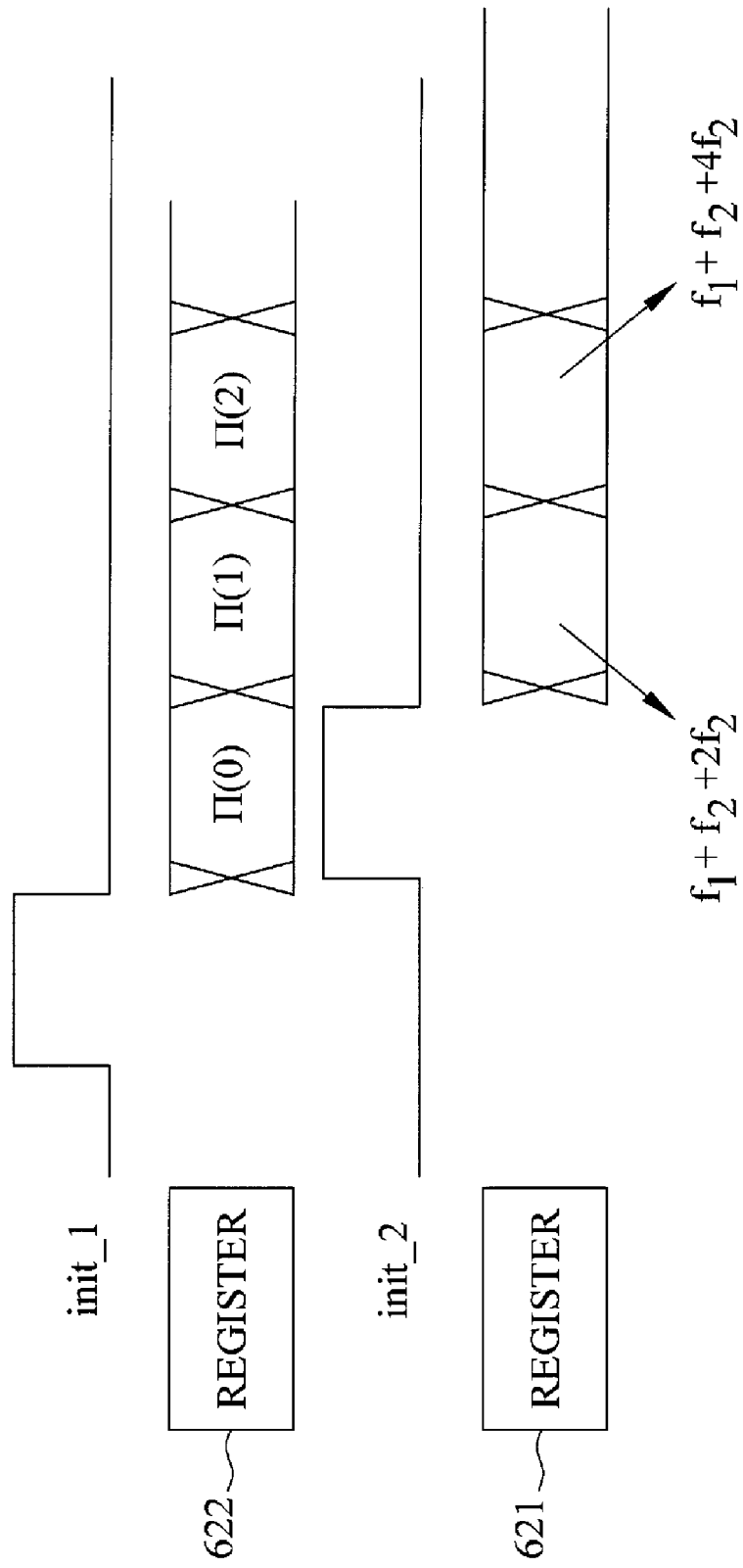
FIG. 6B shows an exemplary schematic view of the timing sequence control of control signals for the basic recursive unit of FIG. 6A, consistent with certain disclosed embodiments.

Hence, basic recursive unit may input a set of configurable parameters, such as, $\{\Pi(0), f_1+f_2, 2f_2\}$, to generate interleaver addresses $\Pi(0), \Pi(1), \Pi(2)$, and so on, where the hardware structure of basic recursive unit and timing sequence control may be described as in FIG. 6A and FIG. 6B, consistent with certain disclosed embodiments.

In the exemplary embodiment of FIG. 6A, basic recursive unit may be implemented with three multiplexers 611-613, two registers 621, 622, and two 2-input add-then-modulus circuits 631, 632, in collaboration with two control signals init_1, init_2. The exemplary embodiment of FIG. 6B describes the timing sequence control of two control signals init_1, init_2, and the interleaver address $\Pi(i)$ and function value $g(i)$ temporarily stored on registers 621, 622 according to the timing sequence control.

The 2-input add-then-modulus circuit is a general modulus circuit, such as, addition of two operands A, B. After addition, the remainder is obtained after a modulus K computation, i.e., (A+B) mod K. The circuit may be realized with two adders and a multiplexer. The following refers to FIG. 6A and FIG. 6B to describe the operation of the internal elements of the basic recursive unit.

In FIG. 6A, basic recursive unit uses multiplexers 611-613, 2-input add-then-modulus circuit 631 and 2-input add-then-modulus circuit 632 to input a set of configurable parameters, such as, $\{\Pi(0), f_1+f_2, 2f_2\}$. Then, as shown in FIG. 6B, control signal init_1 is triggered (i.e., the logic level of init_1 is high). At this point in FIG. 6A, multiplexer 613 outputs the inputted parameter $\Pi(0)$ to register 622. Then, when the triggering edge of control signal init_1 is low, control signal init_2 is triggered (i.e., the logic level of init_2 is high). At this point in FIG. 6A, multiplexer 612 outputs the inputted parameter $f_1+f_2$, i.e., function value $g(0)$, to 2-input add-then-modulus circuit 632. When $\Pi(0)$ in register 622 is outputted, $\Pi(0)$ is also fed back to 2-input add-then-modulus circuit 632. In other words, the initial values of $\Pi(0)$ and $g(0)$ are set by triggering control signals init_1 and init_2, respectively. At this point, multiplexer 611 also outputs the inputted parameter $f_1+f_2$ to 2-input add-then-modulus circuit 631.

Then, the two operands of 2-input add-then-modulus circuit 632, i.e., $\Pi(0)$ and $g(0)$, after modulus computation, generate an interleaver address $\Pi(1)$, while the two operands of 2-input add-then-modulus circuit 631, i.e., $f_1+f_2$ and $2f_2$, after modulus computation, generate $f_1+f_2+2f_2$, i.e., $g(1)$, and outputs to register 621. Interleaver address $\Pi(1)$, through multiplexer 613, is outputted to first recursive unit 511 and register 622 respectively. In other words, when $\Pi(1)$ is outputted to first recursive unit 511, register 622 stores $\Pi(1)$ and register 611 stores $g(1)$.

Then, when $\Pi(1)$ in register 622 is outputted, $\Pi(1)$ is fed back to 2-input add-then-modulus circuit 632. When $g(1)$ in register is fed back to multiplexer 611, $g(1)$ is also outputted through multiplexer 612 to 2-input add-then-modulus circuit 632. Multiplexer 611 outputs $g(1)$ to 2-input add-then-modulus circuit 631. Therefore, the two operands of 2-input add-then-modulus circuit 632, i.e., $g(1)$ and $\Pi(1)$, after modulus computation, generate the next interleaver address $\Pi(2)$. The two operands of 2-input add-then-modulus circuit 631, i.e., $g(1)$ and $2f_2$, after modulus computation, generate $g(2)$ and output to register 621. Interleaver address $\Pi(2)$ is then outputted through multiplexer 613 to first recursive unit 511 and register 622. In other words, when $\Pi(2)$ is outputted to first recursive unit 511, register 622 stores $\Pi(2)$ and register 621 stores $g(2)$.

Similarly, for each i, i=0, 1, 2, ..., M−1, after $\Pi(i)$ in register 622 is outputted, the two operands of 2-input add-then-modulus circuit 632, i.e., $g(i)$ and $\Pi(i)$, after the modulus computation, generate the next interleaver address $\Pi(i+1)$. The two operands of 2-input add-then-modulus circuit 631, i.e., $g(i)$ and $2f_2$, after the modulus computation, generate the next interleaver address $g(i+1)$, and output to register 621. Interleaver address $\Pi(i+1)$, through multiplexer 631, is outputted to first recursive unit 511 and register 622.

In the first exemplary embodiment, first recursive 511 to L-th recursive unit 51L are designed according to recursive formula (2) and another recursive function $h(i)$, as follows:

Let $m = m_1 + m_2$, and from recursive formula (2), i.e.

$$\Pi(i+M) = (\Pi(i)+f_1M+f_2M^2+2f_2i) \bmod k, \text{ it may be obtained that}$$

$$\Pi(i+m_1+m_2) = (\Pi(i+m_1)+f_1m_2+2m_1m_2f_2+f_2m_2^2+2m_2f_2i) \bmod k,$$

Let $h(i) = (f_1m_2+2m_1m_2f_2+f_2m_2^2+2m_2f_2i) \bmod k$, it may be obtained that $$h(i+1) = (h(i)+2m_2f_2) \bmod k.$$

Figure 7:
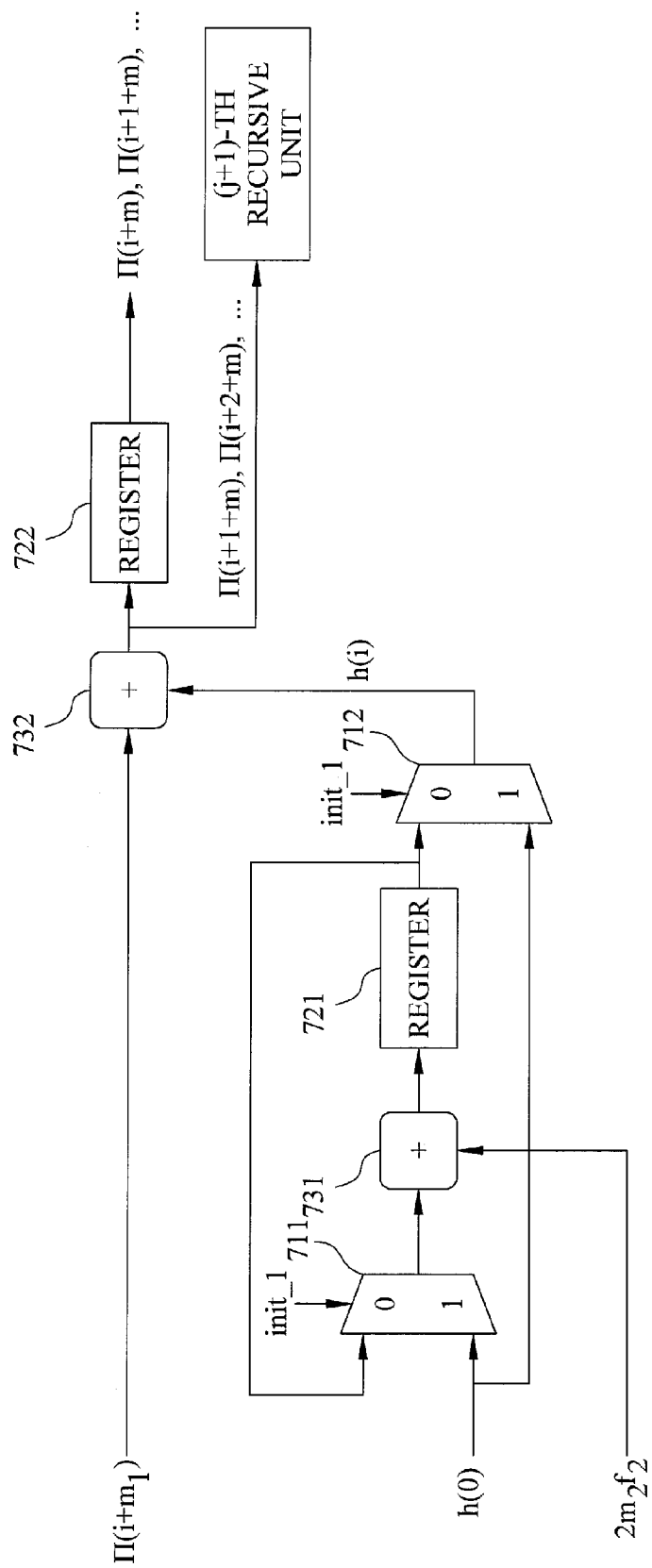
FIG. 7 shows an exemplary schematic view of the recursive unit 51j of first recursive unit to the L-th recursive unit of the first embodiment, consistent with certain disclosed embodiments.

Take $m_1 = 0, M, 2M, \ldots$; and $m_2 = M = 32$, as example, it may be obtained that $\Pi(i+m_1+m_2) = \Pi(i+0+M)$, that is, $\Pi(32), \Pi(33), \Pi(34), \ldots$ $\Pi(i+m_1+m_2) = \Pi(i+M+M)$, that is, $\Pi(64), \Pi(65), \Pi(66), \ldots$ $\Pi(i+m_1+m_2) = \Pi(i+2M+M)$, that is, $\Pi(96), \Pi(97), \Pi(98), \ldots$ Hence, a set of input parameters of each recursive unit 51j of first recursive unit 511 to L-th recursive unit 51L may be designed as $\{\Pi(i+m_1), h(0), 2m_2f_2\}$, $h(0) = f_1 m_2 + 2m_1 m_2 f_2 +$ $f_2 m_2^2$, and the internal structure is shown as FIG. 7, consistent with certain disclosed embodiments.

In FIG. 7, each recursive unit 51*j* may be realized with two multiplexers 711, 712, two registers 721, 722, two 2-input-adder-modulus circuits 731, 732 in combination with control signal init_1. Recursive unit 51*j* uses multiplexers 711, 712, 2-input add-then-modulus circuit 731 and 2-input add-then-modulus circuit 732 to input a set of configurable parameters, such as, $\{\Pi(i+m_1), h(0), 2m_2f_2\}$. Then, when i=0, first, control signal init_1 is triggered (i.e., the logic level of init_1 is high). At this point, multiplexer 712 outputs the inputted parameter h(0) to 2-input add-then-modulus circuit 732. Then, multiplexer 711 outputs the inputted parameter h(0) to 2-input add-then-modulus circuit 731. In other words, the initial value of h(0) is set by triggering control signal init_1.

Then, the two operands of 2-input add-then-modulus circuit 732, i.e., $\Pi(i+m_1)$ and h(0), after modulus computation, generate an interleaver address $\Pi(i+m)$. And the interleaver address $\Pi(i+m)$ is outputted to register 722.

The two operands of 2-input add-then-modulus circuit 731, i.e., h(0) and $2m_2f_2$, after modulus computation, generate h(1). And h(1) is outputted to register 721.

After $\Pi(i+m)$ in register 722 is outputted, when $i \geq 1$, h(i) in register 721 is fed back to multiplexer 711, h(i) is also outputted to multiplexer 712. Multiplexer 712 outputs h(i) to 2-input add-then-modulus circuit 732. Therefore, the two operands of 2-input add-then-modulus circuit 732, i.e., h(i) and $\Pi(i+m_1)$, after modulus computation, generate the next interleaver address $\Pi(i+1+m)$. Interleaver address $\Pi(i+1+m)$ is then outputted to the next recursive unit 51(*j*+1) and register 722 simultaneously.

In other words, after recursive unit 51*j* outputs interleaver address $\Pi(i+m)$, the two operands of 2-input add-then-modulus circuit 731, i.e., h(i) and $2m_2f_2$, after modulus computation, generate h(i+1) and output h(i+1) to register 721. The two operands of 2-input add-then-modulus circuit 732, i.e., h(i+1) and $\Pi(i+1+m_1)$, after modulus computation, generate the next interleaver address $\Pi(i+1+m)$. Interleaver address $\Pi(i+1+m)$ is then outputted to the next recursive unit and register 722 stores interleaver address $\Pi(i+1+m)$.

Figure 8:
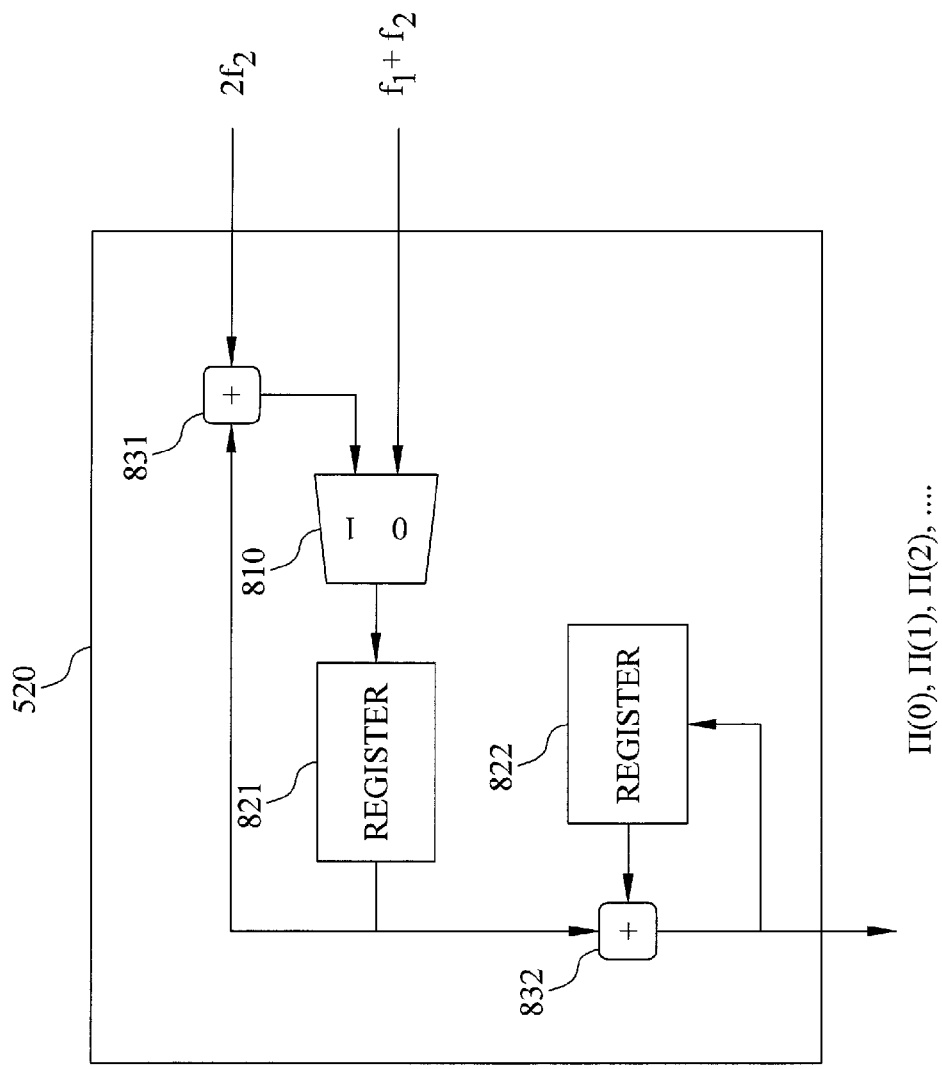
FIG. 8 shows an exemplary schematic view of the hardware structure of the basic recursive unit of a second exemplary embodiment, consistent with certain disclosed embodiments.

In the exemplary second embodiment, the basic recursive unit is designed according to recursive formula (1) to input configurable parameters, such as, $\{f_1+f_2, 2f_2\}$. The structure is shown in FIG. 8 according to the present invention. In the exemplary embodiment of FIG. 8, the basic recursive unit may be realized with a multiplexer 810, two registers 821, 822, and two 2-input add-then-modulus circuits 831, 832. Configurable parameters, $f_1+f_2$, $2f_2$, after inputted to basic recursive unit, are directly used by multiplexer 810, registers 821, 822, and 2-input add-then-modulus circuits 831, 832 to compute interleaver addresses, $\Pi(0)$, $\Pi(1)$, $\Pi(2)$, and so on. The initial values of registers 821, 822 may be set to 0 and $\Pi(0)$, respectively. The values of registers 821, 822 may be changed at clock edge.

Figure 9:
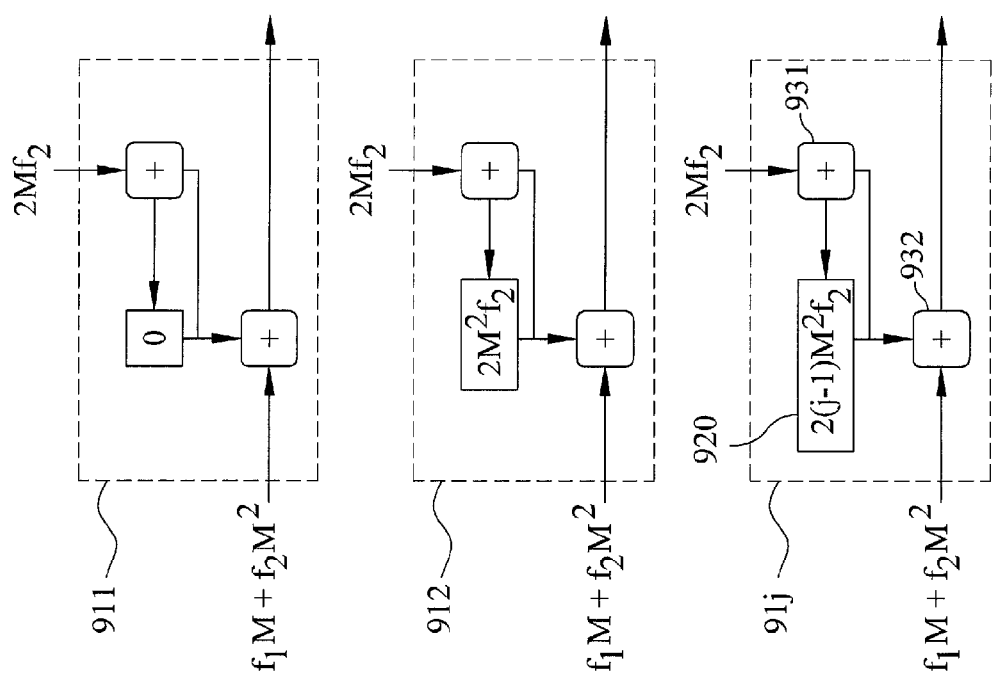
FIG. 9 shows an exemplary schematic view of the first recursive unit to the L-th recursive unit of the second embodiment, consistent with certain disclosed embodiments.

In the second exemplary embodiment, first to L-th recursive units are designed according to recursive formula (2), with hardware structure as shown in FIG. 9, consistent with certain disclosed embodiments. In the exemplary embodiment of FIG. 9, j-th recursive unit 91*j* may input configurable parameters, such as, $2Mf_2$ and $f_1M+f_2M^2$, and uses a register 920, and two 2-input add-then-modulus circuits 931, 932 to compute a sequence of interleaver addresses, that is, j-th sequence $\{\Pi(i+jM)\}$. The value in register 920 is $2(j-1)M^2f_2$, for example, when j=1, the value in register of recursive unit 911 is 0, and when j=2, the value in register of recursive unit 911 is $2M^2f_2$.

Figure 10:
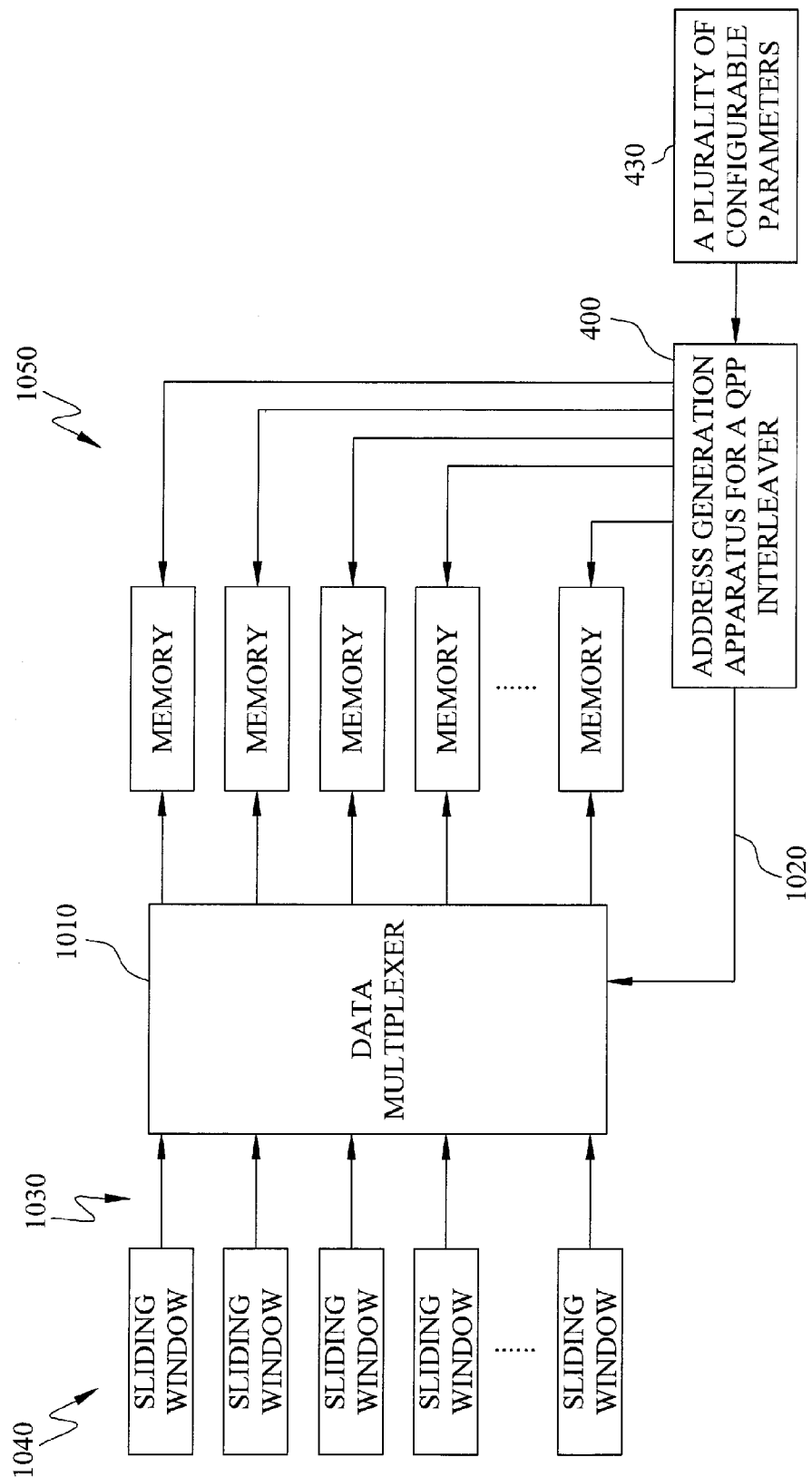
FIG. 10 shows an exemplary schematic view of an address generation apparatus for QPP interleaver storing a plurality of data outputted in parallel from a plurality of sliding windows to memory, consistent with certain disclosed embodiments.

FIG. 10 shows an exemplary schematic view, illustrating how address generation apparatus 400 for a QPP interleaver uses a plurality of sliding windows to output a plurality of data to memory in parallel. Referring to FIG. 10, address generation apparatus 400 for a QPP interleaver, according to the inputted configurable parameters 430, such as, k $(f_1+f_2)$ mod k, $2f_2$ mod k, $2Mf_2$ mod k, $f_1M$ mod k, $f_2M^2$ mod k} or $\{k, f_1+f_2, 2f_2, 2Mf_2, \text{and } f_1M+f_2M^2\}$, generates interleaver address $\Pi(i)$, $\Pi(i+M)$, $\Pi(i+2M)$, ..., $\Pi(i+LM)$, and outputs memory selection information 1020 to a data multiplexer 1010. The memory selection information 1020 is the information of part of the bits of $\Pi(i)$, $\Pi(i+M)$, $\Pi(i+2M)$, ..., $\Pi(i+LM)$, for example, the most significant bits (MSB) n bits. After data multiplexer 1010 receives a plurality of data 1030 outputted in parallel by a plurality of sliding windows 840, and memory selection information 1020 from address generation apparatus 400 for QPP interleaver, data multiplexer 1010 outputs each of data 1030 into a corresponding selected memory address. The corresponding selected memory address 1050 may be obtained from the interleaver address computed directly by address generation apparatus 400 for a QPP interleaver.

Figure 11:
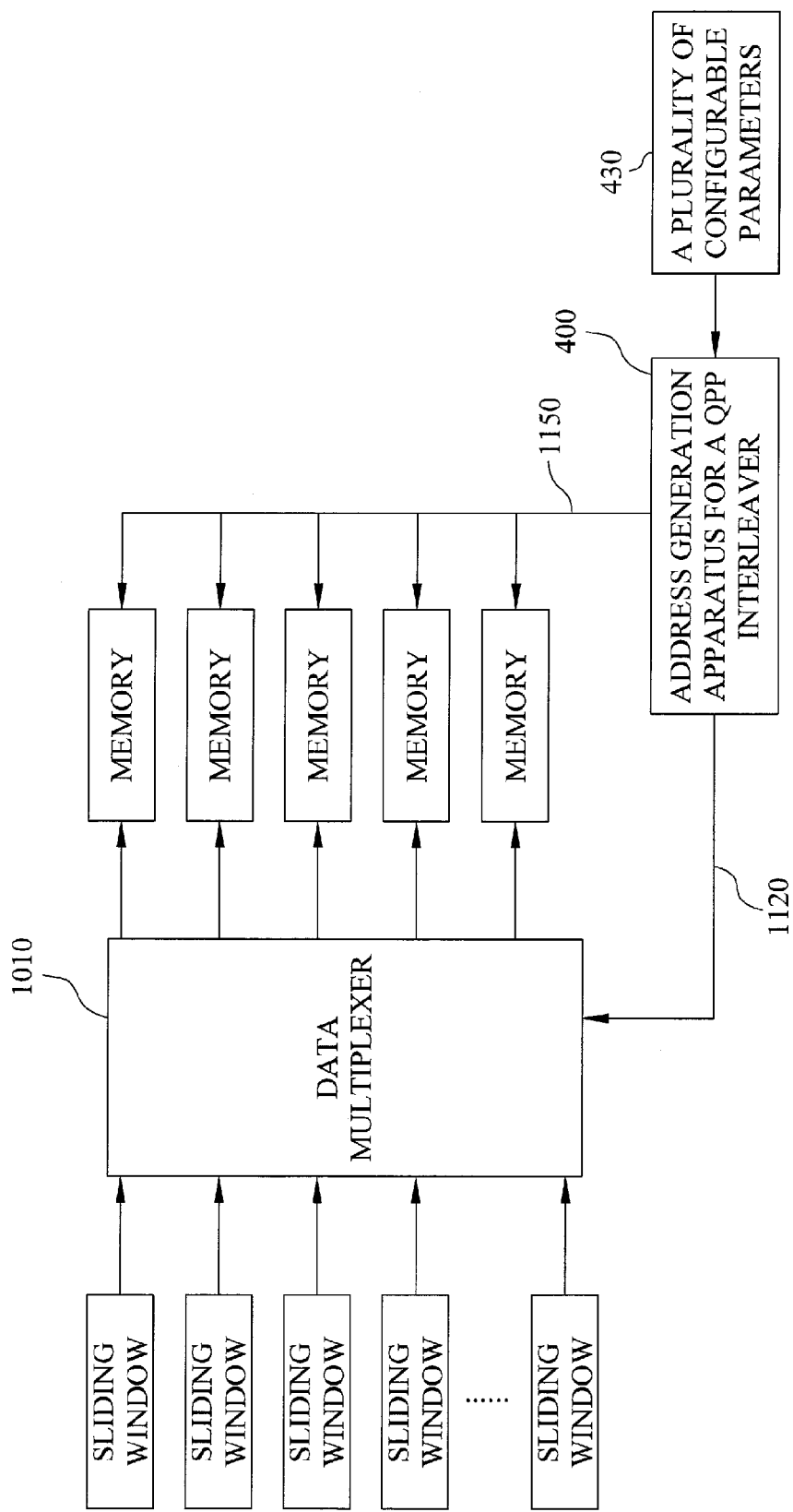
FIG. 11 shows an exemplary schematic view of an address generation apparatus for a QPP interleaver storing a plurality of data outputted in parallel from five sliding windows to memory, consistent with certain disclosed embodiments.

Take k=40, $M=8=2^3$ as example. FIG. 11 shows how address generation apparatus 400 for a QPP interleaver stores the data outputted by five sliding windows in parallel into the memory addresses generated by address generation apparatus 400 for the QPP interleaver. In the exemplary embodiment of FIG. 11, input sequence information block length k=40, and the width of each sliding window M=8. When address generation apparatus 400 for a QPP interleaver computes, in parallel, interleaver addresses $\Pi(i)$, $\Pi(i+8)$, $\Pi(i+16)$, ..., $\Pi(i+40)$, it outputs the MSB 3 bits information of $\Pi(i)$, $\Pi(i+8)$, $\Pi(i+16)$, ..., $\Pi(i+40)$ to data multiplexer 1010 simultaneously. After data multiplexer 1010 simultaneously receives the five data output in parallel by five sliding windows and the MSB 3 bits information of $\Pi(i)$, $\Pi(i+8)$, $\Pi(i+16)$, ..., $\Pi(i+40)$, the five data are outputted in parallel to the five memory addresses, determined by the MSB 3 bits information of $\Pi(i)$, $\Pi(i+8)$, $\Pi(i+16)$, ..., $\Pi(i+40)$. Memory address 1150 is determined by the LSB 3 bits of $\Pi(i)$. That is, the five data are outputted in parallel to five different memories, and each of these five memories uses the same memory address to store these five data.

Figure 12:
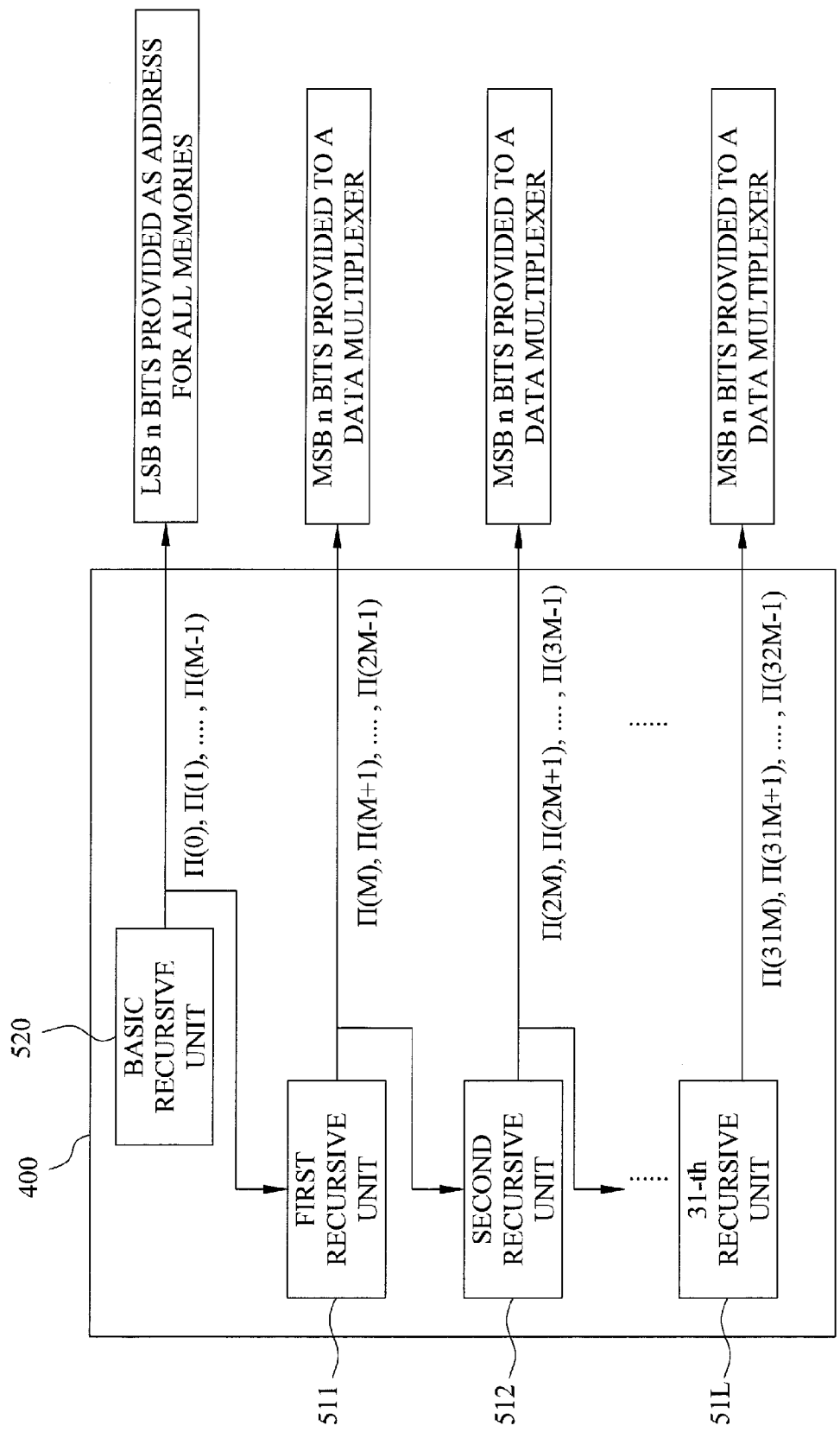
FIG. 12 shows an exemplary schematic view of the use of the bits of the interleaver addresses computed by each recursive unit in an address generation apparatus for a QPP interleaver, consistent with certain disclosed embodiments.

In other words, when $M=2^n$, as shown in the exemplary embodiment of FIG. 12, the LSB n bits of the interleaver address $\Pi(i)$ computed by basic recursive unit 520 are provided to all the memory as address, and the MSB n bits are provided to a data multiplexer, such as, a data multiplexer of logarithmic-corresponding processor, to select a memory. n may be viewed as the number of bits of the address buses. That is, each memory has $2^n$ memory addresses.

FIG. 13 uses k=40, $M=2^3$, $f_1=3$, $f_2=10$, as example to describe how to determine memory address through the interleaver address computed by address generation apparatus for a QPP interleaver, consistent with certain disclosed embodiments. Assume that $\Pi(0)=0$. Based on recursive formula (1), basic recursive unit computes the sequence $\Pi(1)=13$, $\Pi(2)=6$, $\Pi(3)=19$, $\Pi(4)=12$, $\Pi(5)=25$, $\Pi(6)=18$, and $\Pi(7)=31$. When i=0, $\Pi(0)=0=(000000)_2$, the LSB 3 bits are $(000)_2$, provided to memories 0-4 as address. The MSB 3 bits are $(000)_2$, and the data multiplexer transmits the data outputted from sliding window 0 to memory 0 accordingly.

When i=0, based on recursive formula (2), recursive unit 1 computes $\Pi(8)=24=(011000)_2$ and the MSB 3 bits of $\Pi(8)$ are $(011)_2=3$, then the data multiplexer transmits the data outputted from sliding window 1 to memory 3 accordingly. Based on recursive formula (2), recursive unit 2 computes $\Pi(16)=8=$ $(001000)_2$ and the MSB 3 bits of $\Pi(16)$ are $(001)_2=1$, then the data multiplexer transmits the data outputted from sliding window 2 to memory 1 accordingly. Based on recursive formula (2), recursive unit 3 computes $\Pi(24)=32=(100000)_2$ and the MSB 3 bits of $\Pi(24)$ are $(100)_2=4$, then the data multiplexer transmits the data outputted from sliding window 3 to memory 4 accordingly. Based on recursive formula (2), recursive unit 4 computes $\Pi(32)=16=(010000)_2$ and the MSB 3 bits of $\Pi(32)$ are $(010)_2=2$, then the data multiplexer transmits the data outputted from sliding window 4 to memory 2 accordingly.

Similarly, when i=1, $\Pi(1)=13=(001101)_2$, and its LSB 3 bits are $(101)_2$ provided to memories 0-4 as address. And its MSB 3 bits are $(001)_2$, hence, the data multiplexer transmits the data outputted from sliding window 0 to memory 1 accordingly. Recursive units 1-4 compute, in parallel, $\Pi(9)=(100101)_2$, $\Pi(17)=(010101)_2$, $\Pi(25)=(000101)_2$, $\Pi(33)=(011101)_2$, and data multiplexer outputs, in parallel, the data outputted from sliding windows 1-4 to memory 4, 2, 0, 3, respectively. Hence, when i=7, the last five data are transmitted in parallel to memory 0-4. Each memory has 8 addresses, and 8 data outputted from sliding window are written into the memory.

FIG. 14 shows an example of the aforementioned 40 data outputted from sliding window, i.e., data input index i=0, 1, 2, ..., 39, corresponding interleaver address $\Pi(i)$, binary representation, LSB 3 bits and memory. As may be seen from FIG. 14, for a specific width of sliding window (8 in this example), the computation does not need complex circuitry, such as, multiplier, and the output data are stored to the same address in each of memories 0-4.

In comparison with the conventional technique using a structure of large amount of memory, the disclosed exemplary embodiments may reduce the amount of hardware area. For example, when applied to 3GPP LTE system, the disclosed exemplary embodiments may reduce the chip area. Because the low complexity of hardware, the values of M and L may also be designed and adjusted to fit the output order of the sliding windows.

Figure 15:
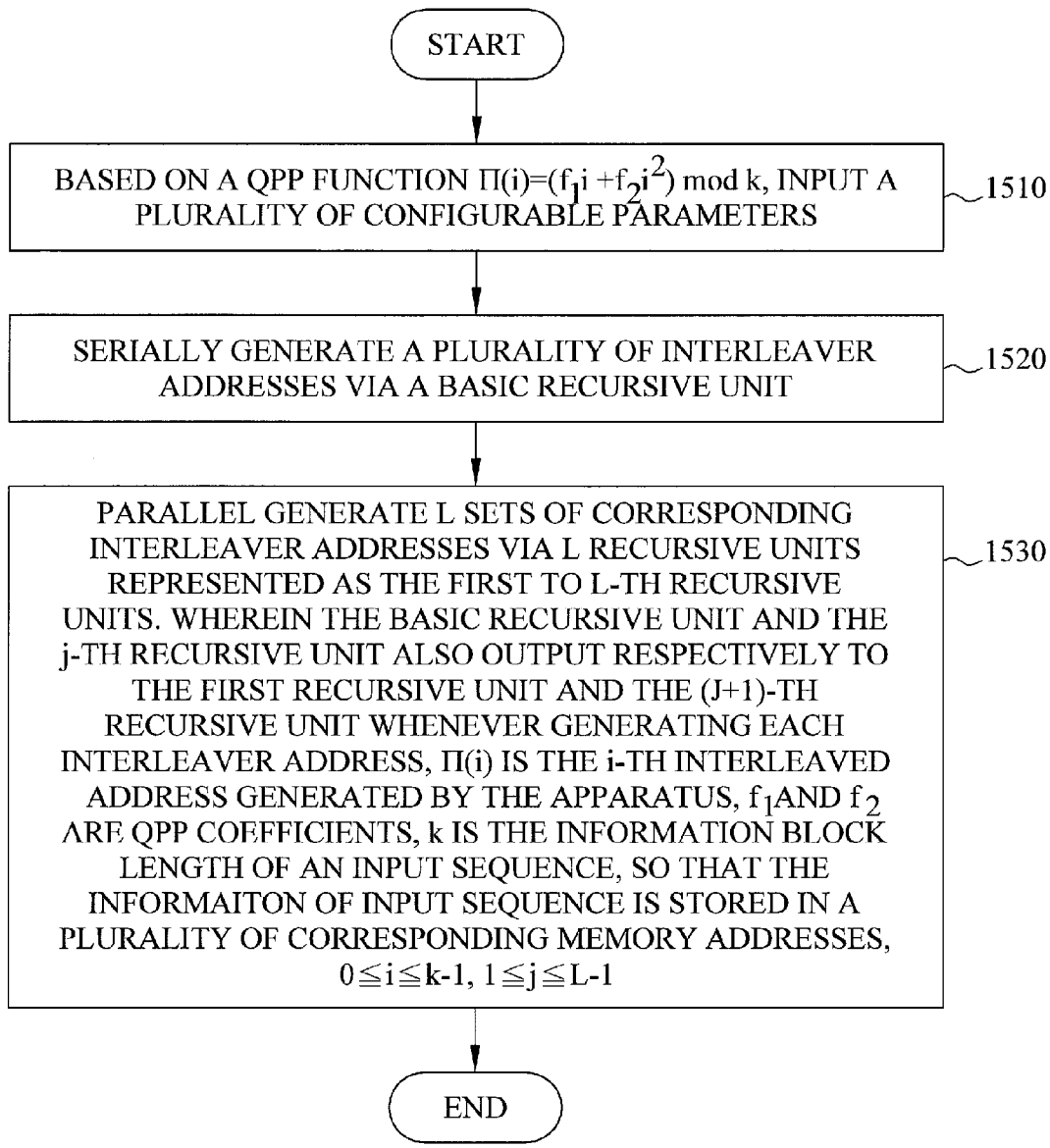
FIG. 15 shows an exemplary flowchart of an address generation method for a QPP interleaver, consistent with certain disclosed embodiments.

Accordingly, FIG. 15 shows an exemplary flowchart of an address generation method for a QPP interleaver, consistent with certain disclosed embodiments. Referring to FIG. 15, based on a QPP function $\Pi(i)=(f_1 i+f_2 i^2)$ mod k, step 1510 is to input a plurality of configurable parameters. In step 1520, it is to serially generate, via a basic recursive unit, a plurality of interleaver addresses, i.e., $\Pi(0), \Pi(1), \Pi(2)$, and so on. In step 1530, it is to parallel generate L sets of corresponding interleaver addresses via L recursive units represented as the first to L-th recursive units. Wherein the basic recursive unit and the j-th recursive unit also output respectively to the first recursive unit and the (j+1)-th recursive unit whenever generating each interleaver address, $\Pi(i)$ is the i-th interleaved address generated by the apparatus, $f_1$ and $f_2$ are QPP coefficients, k is the information block length of an input sequence, so that the information of input sequence is stored in a plurality of corresponding memory addresses, $0 \leq i \leq k-1$, $1 \leq j \leq L-1$.

In step 1520, based on recursive formula (1), basic recursive unit may directly compute $\Pi(0), \Pi(1), \Pi(2)$, and so on, while in step 1530, first recursive unit to L-th recursive unit, based on recursive formula (2), may compute in parallel L sets of corresponding sequences. The j-th interleaver address is also the j-th sequence $\{\Pi(i+jM)\}$, as aforementioned exemplary embodiment of FIG. 5; thus the description is omitted here.

When $M=2^n$, as shown in FIG. 12 and FIG. 13, each interleaver address $\Pi(i)$ computed by the basic recursive unit provides the LSB n bits of the interleaver address to all the memories as the address, and provides the MSB n bits to a data multiplexer for selecting a memory from a plurality of memories. In each iteration of the recursive computation, the MSB n bits of the L interleaver addresses computed by first recursive unit to L-th recursive unit are provided to a data multiplexer for selecting L corresponding memories. With the memory selected by the MSB n bits and the address determined by LSB n bits, each data of the input sequence may be written to a corresponding memory address.

In summary, the disclosed address generation apparatus and method for a QPP interleaver of the exemplary embodiments may compute the interleaver address directly and output, in series or in parallel, the computed interleaver addresses. Based on the computed interleaver addresses, with a data multiplexer, each data of the input sequence may be written to a corresponding memory address. This design neither requires complex hardware, such as, a multiplier, nor requires the memory capacity for storing interleaver addresses. The disclosed exemplary embodiments may reduce the hardware complexity, and may be designed to fit the output order of the sliding windows. The disclosed exemplary embodiment may be applicable to the encoder/decoder of the mobile communication systems.

Although the disclosed has been described with reference to the exemplary embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An address generation apparatus for a quadratic permutation polynomial (QPP) interleaver, comprising:
   a basic recursive unit; and
   L recursive units, represented as a first unit to L-th recursive units, $L \geq 2$;
   based on a QPP function $\Pi(i)=(f_1 i+f_2 i^2)$ mod k, i=0, 1, ..., k-1, said apparatus inputs a plurality of configurable parameters, serially generates a plurality of interleaver addresses by using said basic recursive unit, and parallel generates L sets of corresponding interleaver addresses by using said first to L-th recursive units, wherein whenever said basic recursive unit or said j-th recursive unit generates an interleaver address, the interleaver address generated by said basic recursive unit is outputted to said first recursive unit, while the interleaver address generated by said j-th recursive unit is outputted to said (j+1)-th recursive unit, $\Pi(i)$ is the i-th interleaved address generated by said apparatus, $f_1$ and $f_2$ are QPP coefficients, k is information block length of an input sequence, $1 \leq i \leq k-1$, $1 \leq j \leq L-1$, and mod is modulus computation.

2. The apparatus as claimed in claim 1, wherein said j-th recursive unit of said first to L-th recursive units generates a corresponding j-th sequence $\{\Pi(i+jM)\}$, j=1, ..., L, and M=k/L.

3. The apparatus as claimed in claim 2, wherein $M=2^n$, n is a positive integer.

4. The apparatus as claimed in claim 3, wherein least significant bits (LSB) n bits of said interleaver address $\Pi(i)$ are used as address of all memories for storing said input sequence of plurality of data, i=0, 1, ..., k-1.

5. The apparatus as claimed in claim 3, wherein most significant bits (MSB) n bits of L interleaver addresses generated by said L recursive units in each iteration are provided to a data matrix multiplexer to selecting L corresponding memories.

6. The apparatus as claimed in claim 3, wherein based on a recursive formula, said basic recursive unit serially computes said interleaver address $\Pi(i)$, $i=0, 1, \ldots, k-1$, and based on another recursive formula, said L recursive units generate said L sets of corresponding interleaver addresses in parallel.

7. The apparatus as claimed in claim 2, wherein said j-th recursive unit further includes n1 multiplexers, n2 registers and n3 2-input-adder-modulus circuits, and based on a set of configurable parameters, serially generates said corresponding j-th sequence $\{\Pi(i+jM)\}$ by using said n1 multiplexers, said n2 registers and said n3 2-input-adder-modulus circuits, and $n1 \geq 0$, $n2 \geq 1$, $n3 \geq 2$.

8. The apparatus as claimed in claim 7, wherein $n1=2$, $n2=2$, $n3=2$, said set of configurable parameters includes 3 configurable parameters, and said j-th recursive unit requires a control signal to operate.

9. The apparatus as claimed in claim 1, wherein said basic recursive unit further includes k1 multiplexers, k2 registers and k3 2-input add-then-modulus circuits, and based on k4 configurable basic parameters, serially generates said plurality of interleaver addresses by using said k1 multiplexers, said k2 registers and said k3 2-input-adder-modulus circuits, k1, k2, k3, and k4 are all positive integers, and $k2 \geq 2$, $k3 \geq 2$, $k4 \geq 2$.

10. The apparatus as claimed in claim 9, wherein $k1=3$, $k2=3$, $k3=2$, $k4=3$, and said basic recursive unit further requires two control signals to operate.

11. The apparatus as claimed in claim 9, said apparatus further includes L 2-input add-then-modulus circuits, and $k1=1$, $k2=2$, $k3=2$, $k4=2$.

12. The apparatus as claimed in claim 9, said apparatus further includes L 2-input add-then-modulus circuits, $m1=0$, $m2=2$, $m3=1$, and said set of configurable parameters includes one configurable parameter.

13. The apparatus as claimed in claim 1, said apparatus uses said L recursive units to realize a parallel address generation apparatus for an interleaver.

14. The apparatus as claimed in claim 1, said apparatus uses said L recursive units to realize a serial address generation apparatus for an interleaver.

15. The apparatus as claimed in claim 1, said apparatus is also an address generation apparatus for a de-interleaver, wherein said plurality of generated interleaver addresses are addresses for a de-interleaver to read from a memory.

16. An address generation method for a quadratic permutation polynomial (QPP) interleaver, applicable to an encoder/decoder of communication systems, said method comprising:

based on a QPP function $\Pi(i)=(f_1 i+f_2 i^2) \bmod k$, inputting a plurality of configurable parameters, $f_1$ and $f_2$ being QPP coefficients, k being information block length of an input sequence, $0 \leq i \leq k-1$, mod being modulus computation;

serially generating a plurality of interleaver addresses by using a basic recursive unit; and parallel generating L sets of corresponding interleaver addresses by using L recursive units represented as a first to L-th recursive units, $L \geq 2$;

where wherein whenever said basic recursive unit or said j-th recursive unit generates an interleaver address, the interleaver address generated by said basic recursive unit is outputted to said first recursive unit, while the interleaver address generated by said j-th recursive unit is outputted to said (j+1)-th recursive unit, $\Pi(i)$ is i-th interleaved address generated by said method, so that the information of said input sequence is stored in a plurality of corresponding memory addresses.

17. The method as claimed in claim 16, wherein based on a second recursive formula and a second set of configurable parameters, said j-th recursive unit of said first to said L-th recursive units generates in parallel a corresponding j-th sequence $\{\Pi(i+jM)\}$, $j=1, \ldots, L$, $M=k/L$, $1 \leq i \leq L$.

18. The method as claimed in claim 17, wherein said second set of configurable parameters is one of $\{\Pi(i+m_1), h(0), 2m_2 f_2\}$ and $\{k, 2Mf_2, f_1 M+f_2 M^2\}$, $m_1$ and $m_2$ are pre-defined integers, $h(0)=f_1 m_2+2m_1 m_2 f_2+f_2 m_2^2$.

19. The method as claimed in claim 17, wherein $M=2^n$, n is a positive integer.

20. The method as claimed in claim 19, wherein least significant n bits of said interleaver address $\Pi(i)$ are used as address of said plurality of corresponding memories, and most significant n bits are for selecting a memory from said plurality of corresponding memories.

21. The method as claimed in claim 19, wherein most significant n bits of L interleaver addresses generated by said L recursive units are provided for selecting L corresponding memories.

22. The method as claimed in claim 17, wherein information of said input sequence is outputted through L sliding windows in parallel, and M is width of sliding window.

23. The method as claimed in claim 16, wherein based on a first set of configurable parameters and a first recursive formula, said basic recursive unit serially generates $\{\Pi(i)\}$, $i=0, 1, \ldots, M-1$.

24. The method as claimed in claim 23, wherein said first set of configurable parameters is one of $\{\Pi(0), f_1+f_2, 2f_2\}$ and $\{f_1+f_2, 2f_2\}$.

25. The method as claimed in claim 16, wherein said plurality of configurable parameters is one of $\{k, (f_1+f_2) \bmod k, 2f_2 \bmod k, 2Mf_2 \bmod k, f_1 M \bmod k, f_2 M^2 \bmod k\}$ and $\{k, f_1+f_2, 2f_2, 2Mf_2, f_1 M+f_2 M^2\}$.

* * * * *